(12) United States Patent
Zhang et al.

(10) Patent No.: US 11,874,414 B2
(45) Date of Patent: Jan. 16, 2024

(54) DEVICE AND METHOD FOR MEASURING ELECTRON BEAM

(71) Applicants: Tsinghua University, Beijing (CN); HON HAI PRECISION INDUSTRY CO., LTD., New Taipei (TW)

(72) Inventors: Ke Zhang, Beijing (CN); Guo Chen, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 402 days.

(21) Appl. No.: 17/225,726

(22) Filed: Apr. 8, 2021

(65) Prior Publication Data

US 2022/0196482 A1 Jun. 23, 2022

(30) Foreign Application Priority Data

Dec. 17, 2020 (CN) .......................... 202011497804.9

(51) Int. Cl.
*G01T 7/00* (2006.01)
*C01B 32/158* (2017.01)
*G01T 1/29* (2006.01)

(52) U.S. Cl.
CPC .............. *G01T 7/00* (2013.01); *C01B 32/158* (2017.08); *G01T 1/29* (2013.01); *H01J 2237/24405* (2013.01)

(58) Field of Classification Search
CPC ... H01J 2237/24405; H01J 2237/24542; H01J 37/244; G01T 7/00; G01T 1/29; G01T 1/2914; C01B 32/158

USPC ......................................................... 250/397
See application file for complete search history.

(56) References Cited

U.S. PATENT DOCUMENTS

| 7,641,885 | B2 | 1/2010 | Liu et al. |
| 9,469,530 | B2 | 10/2016 | Wei et al. |
| 9,481,125 | B2 | 11/2016 | Wei et al. |
| 11,320,547 | B1 * | 5/2022 | Zhang ...................... G01T 7/00 |
| 2003/0127594 | A1 | 7/2003 | Schneiker |

(Continued)

FOREIGN PATENT DOCUMENTS

| CN | 112011232 | 12/2020 |
| JP | 2005-32542 | 2/2005 |

(Continued)

*Primary Examiner* — Kiet T Nguyen
(74) *Attorney, Agent, or Firm* — ScienBiziP, P.C.

(57) ABSTRACT

An device for measuring electron beam comprises a Faraday cup comprising an opening; a porous carbon material layer located on a surface of the Faraday cup and suspended at the opening; and an electricity meter electrically connected to the porous carbon material layer. A length of a suspended portion of the porous carbon material layer is greater than or equal to a maximum diameter of an electron beam to be measured. A diameter or a width of the porous carbon material layer is smaller than a minimum diameter of a cross section of the electron beam to be measured. The porous carbon material layer comprises a plurality of carbon material particles, and a plurality of micro gaps exist between the plurality of carbon material particles. A method for measuring an electron beam using the device for measuring electron beam is also provided.

20 Claims, 8 Drawing Sheets

(56) References Cited

U.S. PATENT DOCUMENTS

2015/0368105 A1    12/2015  Wei et al.
2022/0196854 A1*   6/2022   Zhang .................. G01T 1/1606
2022/0199361 A1*   6/2022   Zhang .................... H01J 37/28

FOREIGN PATENT DOCUMENTS

| JP | 2008-297195 | 12/2008 |
| JP | 2015-196640 | 11/2015 |
| JP | 2016-003180 | 1/2016 |
| JP | 2020-9779   | 1/2020 |
| TW | 201609528   | 3/2016 |

\* cited by examiner providing the electron beam measuring device 10 or the electron beam measuring device 20 — S1 moving the electron beam to be measured for a first distance relative to the porous carbon material layer 103 or the porous carbon material layer 203, the cross section of the electron beam to be measured passing through and scanning the suspended portion of the porous carbon material layer 103 or the porous carbon material layer 203; and recording the first distance and a first electric signal value in the electricity meter 105 to obtain a first curve, and analyzing the first curve to obtain a first diameter of the electron beam to be measured — S2 rotating the electron beam to be measured, the porous carbon material layer 103 or the porous carbon material layer 203 by an angle; moving the electron beam to be measured for a second distance relative to the porous carbon material layer 103 or the porous carbon material layer 203, the cross section of the electron beam to be measured passing through and scanning the suspended portion of the porous carbon material layer 103 or the porous carbon material layer 203; and recording the second distance and a second electric signal value in the electricity meter 105 to obtain a second curve, and analyzing the second curve to obtain a second diameter of the electron beam to be measured — S3

FIG. 8

DEVICE AND METHOD FOR MEASURING ELECTRON BEAM

CROSS-REFERENCE TO RELATED APPLICATIONS

This application claims all benefits accruing under 35 U.S.C. § 119 from China Patent Application No. 202011497804.9, filed on Dec. 17, 2020, in the China Intellectual Property Office, the contents of which are hereby incorporated by reference. The application is also related to copending applications entitled, "ELECTRONIC BLACKBODY CAVITY AND SECONDARY ELECTRON MEASUREION DEVICE USING THE SAME", filed on Apr. 8, 2021, with file Ser. No. 17/225,702 of; "SECONDARY ELECTRON PROBE AND SECONDARY ELECTRON MEASUREOR", filed on Apr. 8, 2021, with file Ser. No. 17/225,707 of; "METHOD FOR MAKING ELECTRONIC BLACKBODY STRUCTURE AND ELECTRONIC BLACKBODY STRUCTURE", filed on Apr. 8, 2021, with file Ser. No. 17/225,713 of; "ELECTRONIC BLACKBODY MATERIAL AND ELECTRON DETECTOR", filed on Apr. 8, 2021, with file Ser. No. 17/225,721 of; and "DEVICE AND METHOD FOR DETECTING ELECTRON BEAM", filed on Apr. 8, 2021, with file Ser. No. 17/225,696 of.

FIELD

The present disclosure relates to a device and method for measuring electron beam, in particular to a device and method for measuring electron beam comprising a porous carbon material wire structure or a porous carbon material stripe structure.

BACKGROUND

Electrons are accelerated by electric fields, and energy of the electrons is increased. The electrons can be combined into a beam in a vacuum to produce an electron beam. Electron beam technology has been widely used in fields such as manufacturing and refining of high-temperature alloys, welding of high-temperature alloys, surface modification and coating preparation. Electron beam technology is also involved in fields such as aerospace, defense and military industry, and nuclear industry. In the prior art, a shape and a radius of a cross section of the electron beam need to be measured to draw an image of the electron beam.

In conventional devices and methods for measuring electron beam using metal sheets, a size of an electron beam spot is obtained by differentiating a measured electrical curve, the conventional devices and methods for measuring electron beam are easy to be operated. However, scattering of the electron beam occurs on an edge of the metal sheets, thereby affecting accuracy of the measurements by the conventional devices and methods. There is a need to provide a device and method for measuring electron beam with high accuracy.

BRIEF DESCRIPTION OF THE DRAWINGS

Implementations of the present technology will now be described, by way of example only, with reference to the attached figures, wherein:

FIG. 8 is a flow diagram of one embodiment of a method for measuring electron beam.

DETAILED DESCRIPTION

Figure 1:
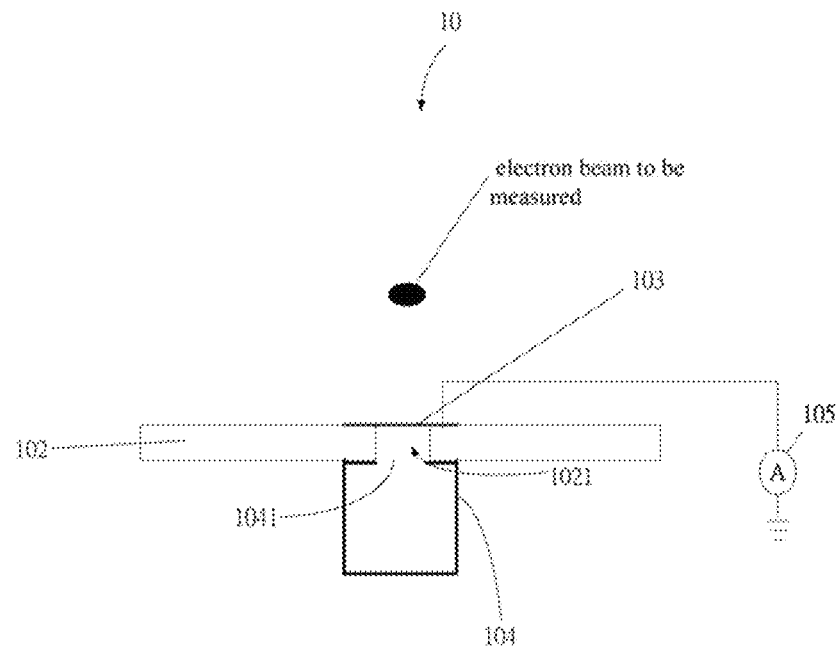
FIG. 1 is a structure schematic diagram of one embodiment of a device for measuring electron beam.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
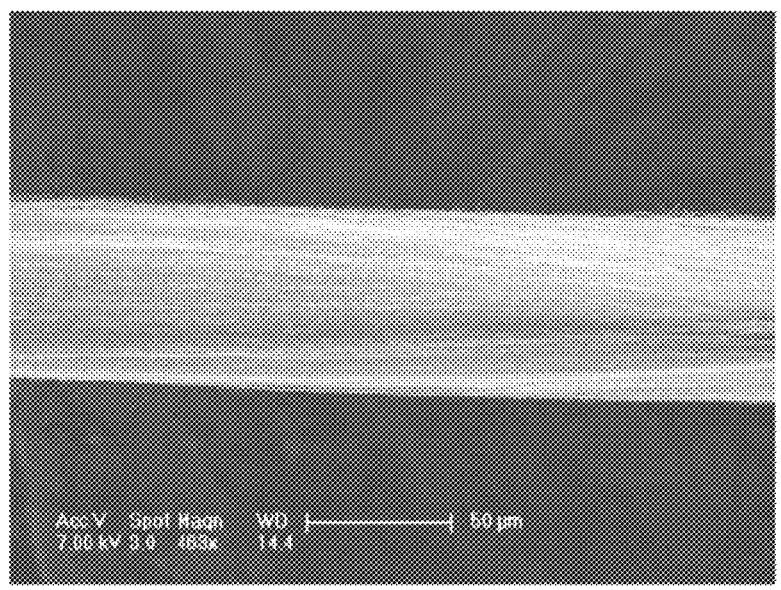
FIG. 2 is a scanning electron micrograph of one embodiment of an untwisted carbon nanotube wire.

Referring to FIG. 1 and FIG. 2, a device 10 for measuring electron beam according one embodiment is provided. The device 10 comprises a substrate 102, a porous carbon material layer 103, a Faraday cup 104, and an electricity meter 105. The electricity meter 105 comprises a first terminal (not labeled) and a second terminal (not labeled), the first terminal is electrically connected to the porous carbon material layer 103, and the second terminal is grounded.

The substrate 102 defines a through hole 1021. The porous carbon material layer 103 is located on a surface of the substrate 102 and suspended in the air at the through hole 1021. A portion of the porous carbon material layer 103 suspended at the through hole 1021 is defined as a suspended portion. A length of the suspended portion of the porous carbon material layer 103 is greater than or equal to a maximum diameter of an electron beam to be measured. The Faraday cup 104 comprises an opening 1041. The Faraday cup 104 is located under the substrate 102. The through hole 1021 and the opening 1041 are penetrable. The Faraday cup 104 is used to collect electrons that pass through the through hole 1021 and not absorbed by the suspended portion of the porous carbon material layer 103, thereby preventing the electrons not absorbed by the suspended portion being reflected to generate secondary electrons, and the secondary electrons being absorbed by the suspended portion again; and thus improving a measurement accuracy of the electron beam to be measured.

The substrate 102 can be a flat structure. A material of the substrate 102 can be glass, plastic, silicon wafer, silicon dioxide wafer, quartz wafer, polymethyl methacrylate (PMMA), polyethylene terephthalate (PET), silicon, silicon with oxide layer, quartz or other insulate material. A size of the substrate 102 is selected according to actual needs. In one embodiment, the porous carbon material layer 102 is a cuboid silicon substrate.

The substrate 102 is an optional element. In one embodiment, the device 10 excludes the substrate 102, the porous carbon material layer 103 is directly located on a surface of the Faraday cup 104, and the porous carbon material layer 103 is suspended through the opening 1041 of the Faraday cup 104.

The porous carbon material layer 103 is a porous carbon material wire structure or a porous carbon material stripe structure. When the porous carbon material layer 103 is the porous carbon material wire structure, a diameter of the porous carbon material wire structure is smaller than a minimum diameter of a cross section of the electron beam to be measured. In one embodiment, the diameter of the porous carbon material wire structure is less than or equal to 20 microns. When the porous carbon material layer 103 is the porous carbon material stripe structure, a width of the porous carbon material stripe structure is smaller than the minimum diameter of the cross section of the electron beam to be measured. The diameter of the porous carbon material wire structure or the width of the porous carbon material stripe structure is much smaller than the minimum diameter of the cross section of the electron beam to be measured, and the smaller the diameter of the porous carbon material wire structure or the width of the porous carbon material stripe structure, the higher the measurement accuracy of the device 10. In one embodiment, the width of the porous carbon material stripe structure is less than or equal to 20 micrometers.

The porous carbon material layer 103 comprises a plurality of carbon material particles, and there are a plurality of micro gaps between the plurality of carbon material particles. A size of each micro gap of the plurality of micro gaps is in nanoscale or microscale. The term "nanoscale" means that the size of each micro gap of the plurality of micro gaps is less than or equal to 1000 nanometers, and the term "microscale" means that the size of each micro gap of the plurality of micro gaps is less than or equal to 1000 micrometers. In some embodiments, the term "nanoscale" means that the size of each micro gap of the plurality of micro gaps is less than or equal to 100 nanometers, and the term "microscale" means that the size of each micro gap of the plurality of micro gaps is less than or equal to 100 micrometers. In one embodiment, the size of each micro gap of the plurality of micro gaps ranges from about 5 micrometers to about 50 micrometers. In one embodiment, the size of each micro gap of the plurality of micro gaps ranges from about 5 micrometers to about 30 micrometers. The porous carbon material layer 103 is a free-standing structure. The term 'free-standing' means that the porous carbon material layer 103 can maintain its own specific shape without being supported by a substrate.

There are a plurality of micro gaps between the plurality of carbon material particles of the porous carbon material layer 103. When the electron beam to be measured irradiates to the porous carbon material layer 103, the electrons of the electron beam to be measured are refracted and reflected multiple times in the micro gaps between the plurality of carbon material particles of the porous carbon material layer 103, and the electrons of the electron beam to be measured cannot be emitted from the porous carbon material layer 103. Therefore, the electron absorption rate of the porous carbon material layer 103 can reach more than 99.99% and almost 100%, the porous carbon material layer 103 can be regarded as an absolute blackbody of electrons. When the electron beam to be measured passes through the suspended portion of the porous carbon material layer 103, the electron beam to be measured intersects the suspended portion of the porous carbon material layer 103, the electrons of the electron beam to be measured are all absorbed by the porous carbon material layer 103, and thus various scattering occurs at the edges of the porous carbon material layer 103 which reduces the measurement accuracy can be avoided.

The plurality of carbon material particles comprise one or two of linear particles and spherical particles. A maximum diameter of a cross section of each of the linear particles is less than or equal to 1000 micrometers. The linear particles can be carbon fibers, carbon micron-wires, carbon nanotubes, and the like. A maximum diameter of each of the spherical particles is less than or equal to 1000 micrometers. The spherical particles can be carbon nanospheres, carbon microspheres, and the like. In one embodiment, the plurality of carbon material particles are a plurality of carbon nanotubes, and the porous carbon material layer 103 is a carbon nanotube wire structure or a carbon nanotube stripe structure. In one embodiment, the carbon nanotube wire structure or the carbon nanotube stripe structure is a pure carbon nanotube structure, the pure carbon nanotube structure means that the carbon nanotube structure consists of carbon nanotubes without other impurities, and the carbon nanotubes are also pure carbon nanotubes. In one embodiment, the porous carbon material layer 103 is the carbon nanotube wire structure.

The carbon nanotube wire structure comprises at least one carbon nanotube wire. When the carbon nanotube wire structure comprises a plurality of carbon nanotube wires, the plurality of carbon nanotube wires can be wound, stacked or coplanar arranged side by side. The carbon nanotube wire can be an untwisted carbon nanotube wire or a twisted carbon nanotube wire.

FIG. 2 illustrates that the untwisted carbon nanotube wire comprises a plurality of carbon nanotubes substantially oriented along a length of the untwisted carbon nanotube wire. The untwisted carbon nanotube wire can be formed by treating a drawn carbon nanotube film with a volatile organic solvent. The drawn carbon nanotube film can be formed by drawing a film from a carbon nanotube array; the drawn carbon nanotube film being a free-standing structure. The drawn carbon nanotube film includes a plurality of carbon nanotube segments joined end-to-end by van der Waals force. Each carbon nanotube segment comprises a plurality of carbon nanotubes substantially parallel to each other, and combined by van der Waals force. A length of the untwisted carbon nanotube wire can be set as desired. A diameter of the untwisted carbon nanotube wire can range from about 0.5 nanometers to about 100 micrometers. The drawn carbon nanotube film is treated by applying an organic solvent to the drawn carbon nanotube film so as to soak the entire surface of the drawn carbon nanotube film. After being soaked by the organic solvent, adjacent parallel carbon nanotubes in the drawn carbon nanotube film will bundle together when the organic solvent volatilizes, due to the surface tension of the organic solvent, thus the drawn carbon nanotube film will shrink into the untwisted carbon nanotube wire. The organic solvent can be volatile organic solvents, such as ethanol, methanol, acetone, dichloroethane, or chloroform. Compared with the drawn carbon nanotube film, a specific surface area of the untwisted carbon nanotube wire is decreased, and a viscosity of the untwisted carbon nanotube wire is increased.

Figure 3:
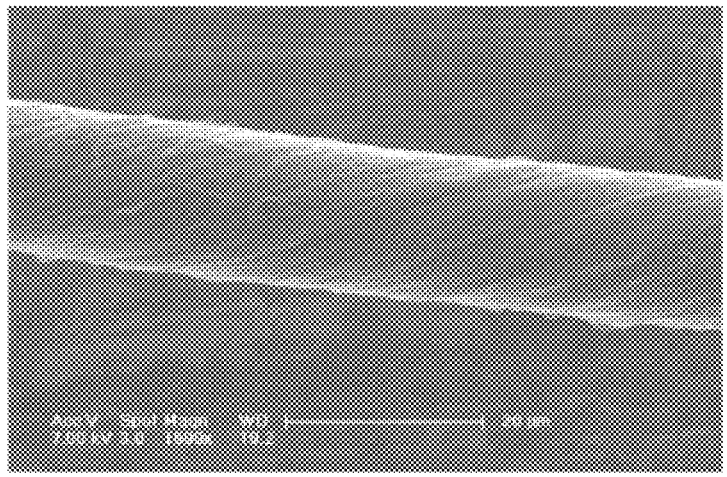
FIG. 3 is a scanning electron micrograph of one embodiment of a twisted carbon nanotube wire.

FIG. 3 illustrates that in one embodiment the carbon nanotube wire is the twisted carbon nanotube wire. The twisted carbon nanotube wire comprises a plurality of carbon nanotubes spirally arranged along an axial direction of the twisted carbon nanotube wire. The twisted carbon nanotube wire is formed by twisting a carbon nanotube film. The carbon nanotube film can be drawn from the carbon nanotube array. The carbon nanotube film includes a plurality of carbon nanotubes parallel with each other. The plurality of carbon nanotubes in the carbon nanotube film are substantially oriented along an axial direction of the carbon nanotube film, and joined end-to-end by van der Waals force in the axial direction of the carbon nanotube film. Therefore when the carbon nanotube film is twisted, the plurality of carbon nanotubes in the twisted carbon nanotube wire are spirally arranged along the axial direction, in an end to end arrangement by van der Waals forces, and extends in a same direction. The twisted carbon nanotube wire has an S twist or a Z twist. During the twisting process of the carbon nanotube film, a space between adjacent carbon nanotubes becomes smaller along a radial direction of the twisted carbon nanotube wire, and a contact area between the adjacent carbon nanotubes becomes larger along the radial direction of the twisted carbon nanotube wire. Therefore, van der Waals attractive force between adjacent carbon nanotubes along the radial direction of the twisted carbon nanotube wire significantly increases, and adjacent carbon nanotubes in the twisted carbon nanotube wire are closely connected.

The electricity meter 105 is used to test a charge generated in the porous carbon material layer 103 and perform a numerical conversion to form an electric signal. The electricity meter 105 can be but not limited to an ammeter or a voltmeter. In one embodiment, the electricity meter 105 is the ammeter, and the ammeter is used to test a current value generated by the charge in the porous carbon material layer 103.

When the device 10 is used, the substrate 102, the porous carbon material layer 103, and the Faraday cup 104 are placed in a vacuum chamber. The vacuum chamber has an entrance, and the electron beam to be measured enters the vacuum chamber through the entrance. The electron beam to be measured is moved relatively to the porous carbon material layer 103 to realize a scanning of the suspended portion of the porous carbon material layer 103 by the electron beam to be measured. The scanning of the porous carbon material layer 103 by the electron beam to be measured can be realized by moving the electron beam to be measured or the porous carbon material layer 103. In one embodiment, the scanning of the porous carbon material layer 103 by the electron beam to be measured is realized by moving the electron beam to be measured. In one embodiment, a moving direction of the electron beam to be measured is perpendicular to a length direction of the porous carbon material layer 103. During the electron beam to be measured is moved relative to the porous carbon material layer 103, a size of the electron beam to be measured irradiating on the porous carbon material layer 103 changes, and the electron absorption rate of the porous carbon material layer 103 can reach more than 99.99% and almost reach 100%, the porous carbon material layer 103 can be regarded as an absolute blackbody of electrons; and thus an amount of the charge generated by the porous carbon material layer 103 changes. Therefore, a diameter of the electron beam to be measured can be obtained according to a change curve of the electric signal in the electric meter 105 with a moving distance of the electron beam to be measured. A plurality of diameters of the electron beam to be measured can be obtained by moving the electron beam to be measured along a plurality of different diameter directions and being perpendicular to the length direction of the porous carbon material layer 103, and then taking an average of the plurality of diameters to get the size of the electron beam to be measured. In one embodiment, a diameter in a horizontal direction and a diameter in a vertical direction are tested. In one embodiment, when the electron beam to be measured moves relative to the porous carbon material layer 103, all the electron beam to be measured irradiate to the suspended portion of the porous carbon material layer 103, and no electron beam irradiates to the two ends of the porous carbon material layer 103 directly in contact with the substrate 102.

After the electron beam to be measured moves perpendicular to the length of the porous carbon material layer 103 along a diameter direction, the electron beam to be measured moves perpendicular to the length of the porous carbon material layer 103 along another diameter direction can be achieved by rotating the electron beam to be measured or rotating the porous carbon material layer 103. That is, the electron beam to be measured is moved perpendicular to the length of the porous carbon material layer 103 along the plurality of diameter directions by rotating the electron beam to be measured or rotating the porous carbon material layer 103. In one embodiment, the porous carbon material layer 103 is located on the substrate 102, and the direction of the porous carbon material layer 103 is changed by rotating the substrate 102.

Figure 4:
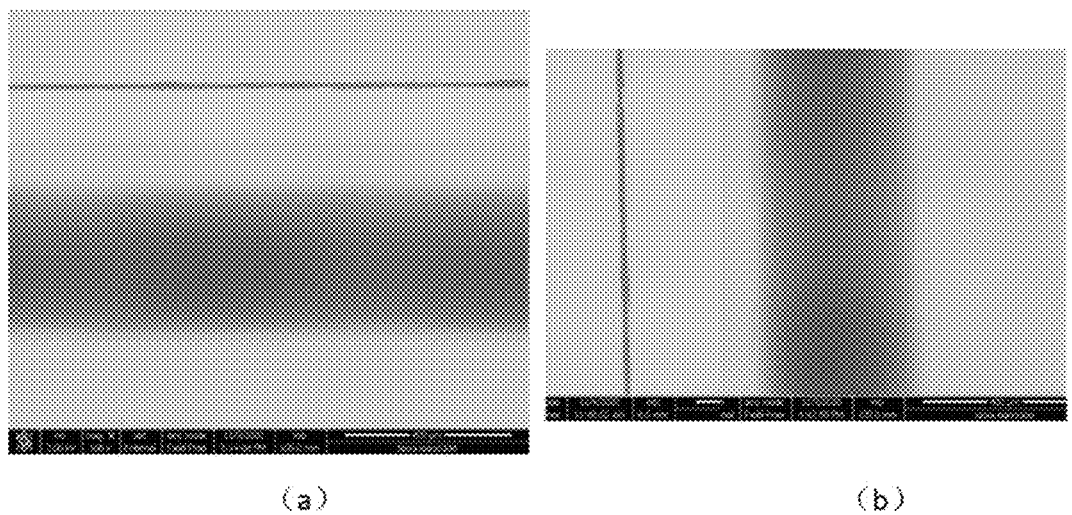
FIG. 4 is a scanning electron microscope photograph when the device in FIG. 1 is used to measure an electron beam.

FIG. 4 is a scanning electron microscope photograph of the device 10 used to measure an electron beam. Referring to FIG. 4a, while keeping a first diameter of the electron beam to be measured parallel to the length of the carbon nanotube wire structure, the electron beam to be measured is moved in a direction perpendicular to the length of the carbon nanotube wire structure. And then referring to FIG. 4b, the carbon nanotube wire structure is rotated by 90 degrees, and while keeping a second diameter of the electron beam to be measured parallel to the length of the carbon nanotube wire structure, the electron beam to be measured is moved along the direction perpendicular to the length direction of carbon nanotube wire structure.

Figure 5:
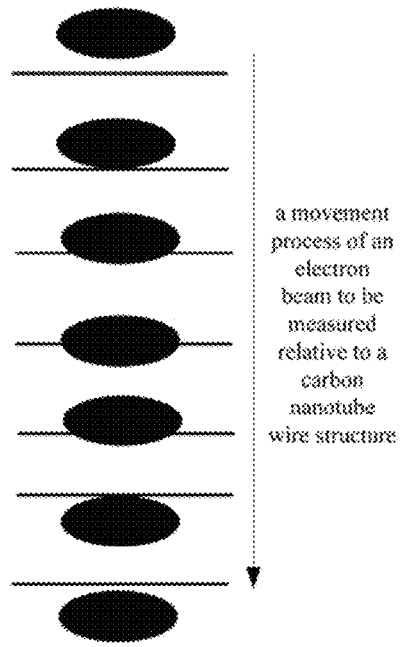
FIG. 5 is a schematic top view of a movement process of an electron beam to be measured relative to a carbon nanotube wire structure when the device in FIG. 1 is used to measure the electron beam to be measured.

Referring to FIG. 5, during a process of moving the electron beam to be measured relative to the carbon nanotube wire structure, at first the electron beam to be measured does not irradiate on the suspended portion of the carbon nanotube wire structure, no charge is generated in the carbon nanotube wire structure, and the electrical signal measured in the electricity meter 105 is substantially zero. The electron beam to be measured continues moving, a small amount of the electron beam to be measured irradiate on the suspended portion of the carbon nanotube wire structure, and a small amount of charge is generated in the carbon nanotube wire structure. As a movement of the electron beam to be measured progresses, the electron beam to be measured irradiating on the suspended portion of the carbon nanotube wire structure increases, and the charge generated in the carbon nanotube wire structure increases. When a maximum diameter of the electron beam to be measured in a direction perpendicular to the moving direction coincides with the suspended portion of the carbon nanotube wire structure, the charge generated in the carbon nanotube wire structure is the most, and an electrical signal value measured in the electricity meter 105 is the largest. And then as the electron beam to be measured continues to move, the charge generated in the carbon nanotube wire structure gradually decreases, and the electrical signal value measured in the electricity meter 105 also gradually decreases. Therefore, a distance from a point where the current value starts to increase from zero to a point where the current value drops to zero again is the diameter of the electron beam to be measured.

Figure 6:
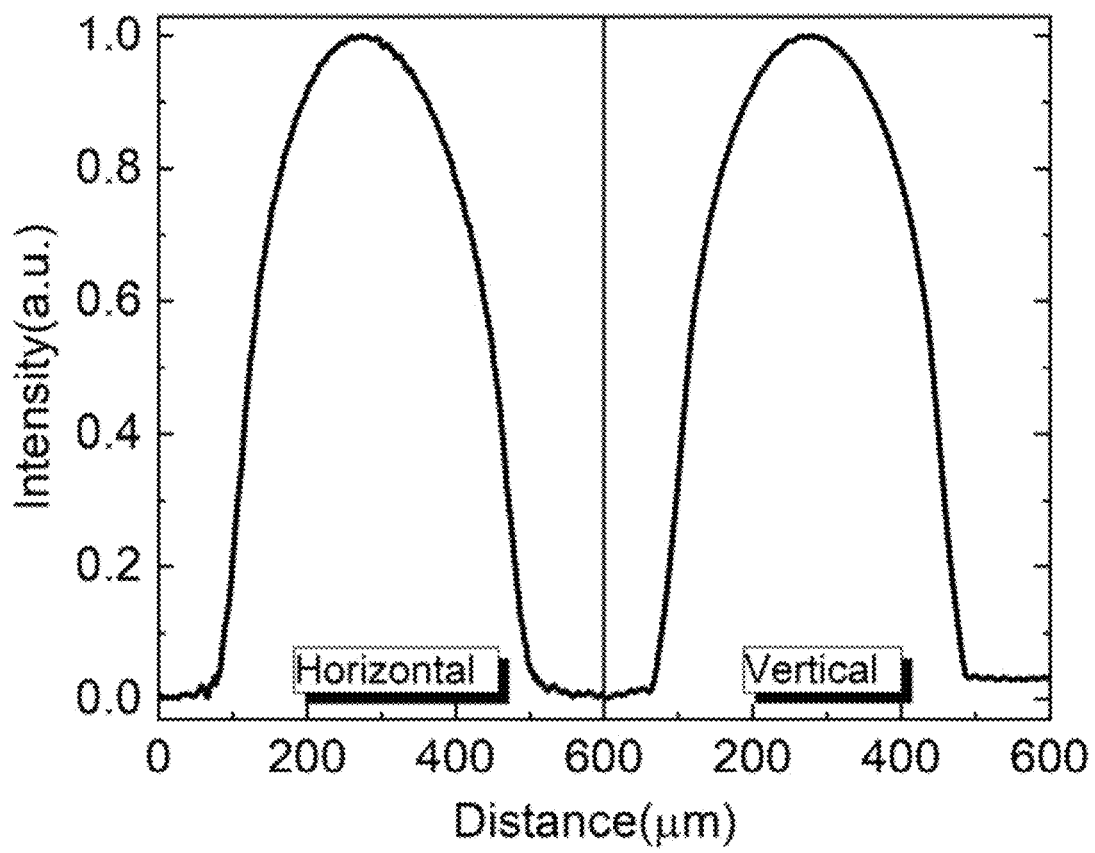
FIG. 6 is a change curve of a current intensity with a moving distance of an electron beam to be measured when the device in FIG. 1 is used to measure the electron beam to be measured.

Referring to FIG. 6, when the device 10 is used to measure an electron beam, a change curve of the current intensity tested by the ammeter with the moving distance of the electron beam. It can be seen from FIG. 6 that the diameter of the electron beam in both directions is substantially the same, both are about 420 micrometers. It can also be seen from FIG. 6 that the change curve of the current intensity with the moving distance of the electron beam tested by the device 10 is substantially consistent with a standard change curve of the current intensity with the moving distance of the electron beam. Therefore, the measurement accuracy of the device 10 is high.

The porous carbon material layer 102 comprises a plurality of carbon material particles, and there are a plurality of nanoscale or microscale gaps between the plurality of carbon material particles. The electrons of the electron beam to be measured are refracted and reflected multiple times in the plurality of nanoscale or microscale gaps between the plurality of carbon material particles. The electrons of the electron beam to be measured cannot be emitted from the porous carbon material layer, and thus the electron absorption rate of the porous carbon material layer can reach more than 99.99% and almost reach 100%. The porous carbon material layer 102 can be regarded as an absolute blackbody of electrons. When the electron beam to be measured irradiates on the suspended portion of the porous carbon material layer, the electrons irradiating on the porous carbon material layer are substantially all collected by the porous carbon material layer, and various scattering occurs at the edge of the porous carbon material layer can be avoided, thereby obtaining more accurate diameters of the electron beam to be measured and improving the measurement accuracy of the electron beam testing device. The Faraday cup is used to collect electrons that pass through the through hole 1021 and not absorbed by the suspended portion of the porous carbon material layer, thereby preventing the electrons not absorbed by the suspended portion of the porous carbon material layer being reflected to generate secondary electrons, and the secondary electrons being absorbed by the suspended portion of the porous carbon material layer again; and thus improving an measurement accuracy of electron beam to be measured. The device 10 comprises the porous carbon material layer, and a size of the electron beam can be obtained through the relative movement of the electron beam to be measured and the porous carbon material layer, a structure of the device 10 is very simple.

Figure 7:
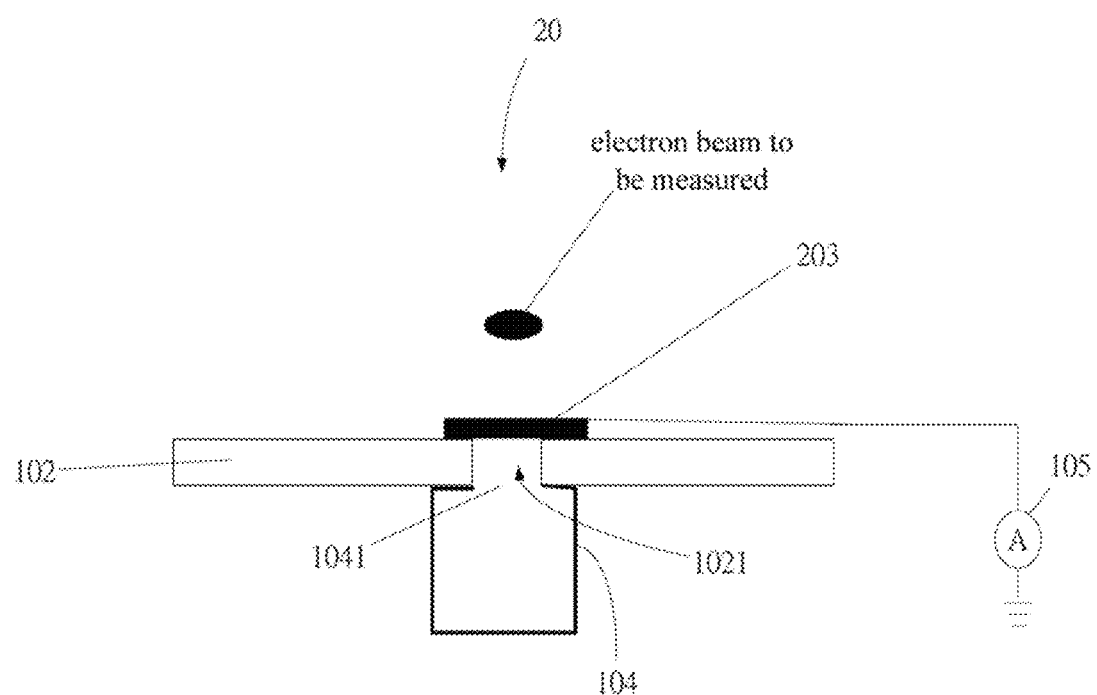
FIG. 7 is a structure schematic diagram of one embodiment of a device for measuring electron beam.

Referring to FIG. 7, one embodiment is described in relation to a device for measuring electron beam 20. The device 20 is substantially the same as the device 10, except that a porous carbon material layer 203 of the device 20 is a carbon nanotube stripe structure. That is, the device 20 can be obtained by replacing the carbon nanotube wire structure in the device 10 with the carbon nanotube stripe structure.

The carbon nanotube stripe structure can comprise a strip of porous carbon nanotube film or a plurality of strips of carbon nanotube films stacked with each other, as long as a width of the carbon nanotube film is smaller than the minimum diameter of the cross section of the electron beam to be measured. The porous carbon nanotube film can be a drawn carbon nanotube film, a flocculated carbon nanotube film or a pressed carbon nanotube film. The carbon nanotube stripe structure can also comprise a strip of porous carbon nanotube paper or a plurality of strips of carbon nanotube papers stacked with each other, as long as a width of the carbon nanotube paper is smaller than the minimum diameter of the cross section of the electron beam to be measured. The width of the carbon nanotube stripe structure is much smaller than the minimum diameter of the cross section of the electron beam to be measured, and the smaller the width of the carbon nanotube stripe structure, the higher the measurement accuracy. In one embodiment, the width of the carbon nanotube stripe structure is less than or equal to 20 micrometers. A length of a suspended portion of the carbon nanotube stripe structure is greater than or equal to the maximum diameter of the electron beam to be measured. The carbon nanotube stripe structure can also be a carbon nanotube network structure or a carbon nanotube array, as long as a width of the carbon nanotube network structure or a width of the carbon nanotube array is smaller than the minimum diameter of the cross section of the electron beam to be measured. In one embodiment, the carbon nanotube stripe structure consists of a plurality of strips of carbon nanotube drawn films stacked with each other.

The drawn carbon nanotube film comprises a number of carbon nanotubes that are arranged substantially parallel to a surface of the drawn carbon nanotube film. A large number of the carbon nanotubes in the drawn carbon nanotube film can be oriented along a preferred orientation, meaning that a large number of the carbon nanotubes in the drawn carbon nanotube film are arranged substantially along the same direction. An end of one carbon nanotube is joined to another end of an adjacent carbon nanotube arranged substantially along the same direction, by van der Waals force, to form a free-standing film. The term 'free-standing' includes films that do not have to be supported by a substrate. The drawn carbon nanotube film can be formed by drawing from a carbon nanotube array. A width of the drawn carbon nanotube film relates to the carbon nanotube array from which the drawn carbon nanotube film is drawn. A thickness of the carbon nanotube drawn film can range from about 0.5 nanometers to about 100 micrometers. Examples of a drawn carbon nanotube film is taught by U.S. Pat. No. 7,992,616 to Liu et al., and US patent application US 2008/0170982 to Zhang et al. In one embodiment, the carbon nanotube film structure is formed by a plurality of drawn carbon nanotube films stacked and crossed with each other. There is a cross angle between the carbon nanotubes in the adjacent carbon nanotube drawn films, and the cross angle is greater 0 degrees and less than and equal to 90 degrees. Therefore, the carbon nanotubes in the plurality of drawn carbon nanotube films are interwoven to form a networked film structure.

The flocculated carbon nanotube film can include a number of carbon nanotubes entangled with each other. The carbon nanotubes can be substantially uniformly distributed in the flocculated carbon nanotube film. The flocculated carbon nanotube film can be formed by flocculating the carbon nanotube array. Examples of the flocculated carbon nanotube film are taught by U.S. Pat. No. 8,808,589 to Wang et al.

The pressed carbon nanotube film can include a number of disordered carbon nanotubes arranged along a same direction or along different directions. Adjacent carbon nanotubes are attracted to each other and combined by van der Waals force. A planar pressure head can be used to press the carbon nanotubes array along a direction perpendicular to the substrate, a pressed carbon nanotube film having a plurality of isotropically arranged carbon nanotubes can be obtained. A roller-shaped pressure head can be used to press the carbon nanotubes array along a fixed direction, a pressed carbon nanotube film having a plurality of carbon nanotubes aligned along the fixed direction is obtained. The roller-shaped pressure head can also be used to press the array of carbon nanotubes along different directions, a pressed carbon nanotube film having a plurality of carbon nanotubes aligned along different directions is obtained. Examples of the pressed carbon nanotube film are taught by U.S. Pat. No. 7,641,885 to Liu et al.

The carbon nanotube paper comprises a plurality of carbon nanotubes arranged substantially along a same direction, and the plurality of carbon nanotubes are joined end to end by van der Waals force in an extending direction, and the plurality of carbon nanotubes are substantially parallel to a surface of the carbon nanotube paper. Examples of the carbon nanotube paper are taught by U.S. Pat. No. 9,017,503 to Zhang et al.

In one embodiment, the carbon nanotube structure is a super-aligned carbon nanotube array. The super-aligned carbon nanotube array comprises a plurality of carbon nanotubes parallel to each other and extending to a same direction. The plurality of carbon nanotubes of the super-aligned carbon nanotube array are joined together through van der Waals forces to form an array. A size, a thickness, and a surface area of the super-aligned carbon nanotube array can be selected according to actual needs. Examples of a method of making the super-aligned carbon nanotube array is taught by U.S. Pat. No. 8,048,256 to Feng et al. The carbon nanotube array is not limited to the super-aligned carbon nanotube array, and can also be other carbon nanotube arrays.

The higher an energy of an electron beam, the greater a penetration depth in the carbon nanotube stripe structure, on the contrary, the smaller the penetration depth. In one embodiment, the energy of the electron beams is less than or equal to 20 keV, and a thickness of the carbon nanotube stripe structure is in a range from about 200 micrometers to about 600 micrometers. When the thickness of the carbon nanotube stripe structure is in the range of 200 micrometers to 600 micrometers, the electron beam does not easily penetrate the carbon nanotube stripe structure and be reflected from the carbon nanotube stripe structure; and the carbon nanotube stripe structure has a high electron absorption rate. In one embodiment, the thickness of the carbon nanotube stripe structure is in a range from 300 micrometers to about 500 micrometers. In another embodiment, the thickness of the carbon nanotube stripe structure is in a range from 250 micrometers to about 400 micrometers.

Except that the carbon nanotube stripe structure replaces the carbon nanotube wire structure of the device 10, other technical features of the device 20 are the same as the device 10.

The porous carbon material layer is not limited to the carbon nanotube stripe structure. The porous carbon material layer can also be a self-standing porous carbon material stripe structure formed by carbon fibers, carbon nanospheres or carbon nanowires.

Referring to FIG. 8, a method for measuring electron beam using a device for measuring electron beam according to one embodiment is provided. The method comprises steps of:

step (S1), providing a device for measuring electron beam, the device for measuring electron beam comprises a porous carbon material layer and an electricity meter;

step (S2), moving an electron beam to be measured for a first distance relative to the porous carbon material layer, a cross section of the electron beam to be measured passing through and scanning a suspended portion of the porous carbon material layer; and recording the first distance and a first electric signal value in the electricity meter to obtain a first curve, and analyzing the first curve to obtain a first diameter of the electron beam to be measured; and step (S3), rotating the electron beam to be measured, the porous carbon material layer by an angle; moving the electron beam to be measured for a second distance relative to the porous carbon material layer, the cross section of the electron beam to be measured passing through and scanning the suspended portion of the porous carbon material layer; and recording the second distance and a second electric signal value in the electricity meter to obtain a second curve, and analyzing the second curve to obtain a second diameter of the electron beam to be measured.

In step (S1), the electron beam measuring device can be the electron beam measuring device 10 or the electron beam measuring device 20 discussed above.

In step (S2), in one embodiment, the electron beam to be measured moves relative to the porous carbon material layer 103 or the porous carbon material layer 203 in a direction perpendicular to a length of the porous carbon material layer 103 or the porous carbon material layer 203. In one embodiment, when the electron beam to be measured moves relative to the porous carbon material layer 103 or the porous carbon material layer 203, all the electron beam to be measured irradiates on the suspended portion of the porous carbon material layer 103 or the porous carbon material layer 203, and no electron beam irradiates on the two ends of the porous carbon material layer 103 or the porous carbon material layer 203.

In the first curve, a distance from a point where a current value starts to increase from zero to a point where a current value drops to zero again is the first diameter of the electron beam to be measured.

In step (S3), the angle is greater than 0 degrees and less than 180 degrees. In one embodiment, the porous carbon material layer 103 or the porous carbon material layer 203 is rotated 90 degrees. Since the porous carbon material layer 103 or the porous carbon material layer 203 is located on the substrate 102, in one embodiment, the porous carbon material layer 103 or the porous carbon material layer 203 is rotated by rotating the substrate 102.

In one embodiment, after rotating the electron beam to be measured, the porous carbon material layer 103 or the porous carbon material layer 203 is rotated by an angle, the electron beam to be measured moves relative to the porous carbon material layer 103 or the porous carbon material layer 203 in the direction perpendicular to the length of the porous carbon material layer 103 or the porous carbon material layer 203. In one embodiment, when the electron beam to be measured moves relative to the porous carbon material layer 103 or the porous carbon material layer 203, all the electron beam to be measured irradiates on the suspended portion of the porous carbon material layer 103 or the porous carbon material layer 203, and no electron beam irradiates on the two ends of the porous carbon material layer 103 or the porous carbon material layer 203.

In the second curve, a distance from a point where a current value starts to increase from zero to a point where a current value drops to zero again is the second diameter of the electron beam to be measured.

When the method is used to measure the electron beam to be measured, the porous carbon material layer, the substrate and the Faraday cup of the electron beam inspection device are placed in a vacuum chamber, and the electron beam to be measured is emitted into the vacuum chamber to be measured.

In some embodiments, in order to increase the accuracy of the method for measuring electron beam, step (S3) is repeated multiple times to obtain a plurality of diameters of the electron beam to be measured.

The device for measuring electron beam provided by the present invention comprises the porous carbon material layer. The size of the electron beam can be obtained by the relative movement of the electron beam to be measured and the porous carbon material layer, and thus the method for measuring electron beam using the device for measuring electron beam is very simple. The plurality of diameters of the electron beam to be measured are obtained by performing multiple relative movements of the electron beam to be measured and the porous carbon material layer, and then the size of the electron beam to be measured is obtained. Therefore, the accuracy of the method for measuring electron beam is high. The porous carbon material layer of the device for measuring electron beam comprises a plurality of carbon material particles, and there are a plurality of nanoscale or microscale gaps between the plurality of carbon material particles. The electrons of the electron beam to be measured are refracted and reflected multiple times in the plurality of nanoscale or microscale gaps between the plurality of carbon material particles, and the electrons of the electron beam to be measured cannot be emitted from the porous carbon material layer, and thus the electron absorption rate of the porous carbon material layer can reach more than 99.99% and almost reach 100%, the porous carbon material layer can be regarded as an absolute blackbody of electrons. When the electron beam to be measured is irradiated on the suspended portion of the porous carbon material layer, the electrons hitting on the porous carbon material layer are substantially all collected by the porous carbon material layer, and various scattering occurs at the edge of the porous carbon material layer can be avoided, thereby obtaining more accurate diameters of the electron beam to be measured and improving the measurement accuracy of the device for measuring electron beam. The Faraday cup is used to collect electrons that pass through the through hole and not absorbed by the suspended portion of the porous carbon material layer, thereby preventing the electrons not absorbed by the suspended portion of the porous carbon material layer being reflected to generate secondary electrons, and the secondary electrons being absorbed by the suspended portion of the porous carbon material layer again; and thus improving an measurement accuracy of electron beam to be measured.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A device for measuring electron beam comprising:
a Faraday cup comprising an opening;
a porous carbon material layer located on a surface of the Faraday cup and suspended via the opening, wherein a portion of the porous carbon material layer suspended in the air at the opening is defined as a suspended portion, a length of the suspended portion is greater than or equal to a maximum diameter of an electron beam to be measured; a diameter or a width of the porous carbon material layer is smaller than a minimum diameter of a cross section of the electron beam to be measured; and the porous carbon material layer comprises a plurality of carbon material particles, and a plurality of micro gaps are defined by the plurality of carbon material particles; and
an electricity meter electrically connected to the porous carbon material layer.

2. The device of claim 1, wherein the porous carbon material layer consists of a plurality of pure carbon material particles, and a material of the plurality of pure carbon material particles consists of carbon atoms.

3. The device claim 1, wherein the plurality of carbon material particles is selected from a group consisting of carbon nanotubes, carbon fibers, carbon nanowires, carbon microspheres and carbon nanospheres.

4. The device of claim 1, wherein the porous carbon material layer is a porous carbon material wire structure.

5. The device of claim 4, wherein the porous carbon material wire structure is a carbon nanotube wire structure comprising a carbon nanotube wire or a plurality of carbon nanotube wires wound, stacked or coplanar arranged side by side.

6. The device of claim 4, wherein a diameter of the porous carbon material wire structure is less than or equal to 20 microns.

7. The device of claim 1, wherein the porous carbon material layer is a porous carbon material stripe structure.

8. The device of claim 7, wherein the porous carbon material stripe structure is a carbon nanotube stripe structure comprising a strip of porous carbon nanotube film or a plurality of strips of carbon nanotube films stacked with each other.

9. The device of claim 7, wherein a width of the porous carbon material stripe structure is less than or equal to 20 microns.

10. The device of claim 1, further comprising a substrate, wherein the substrate comprises a through hole, the substrate is located between the Faraday cup and the porous carbon material layer, the through hole and the opening are penetrable, and the porous carbon material layer is located on a surface of the substrate and suspended at the through hole.

11. The device of claim 1, wherein a thickness of the porous carbon material layer is in a range from 200 micrometers to 600 micrometers.

12. The device of claim 1, wherein a size of each micro gap of the plurality of micro gaps ranges from 5 micrometers to 50 micrometers.

13. A method for measuring an electron beam comprising:
step (S1), providing a device for measuring electron beam, wherein the device comprises:
a Faraday cup comprising an opening;
a porous carbon material layer located on a surface of the Faraday cup and suspended via the opening, wherein a portion of the porous carbon material layer suspended in the air at the opening is defined as a suspended portion, a length of the suspended portion is greater than or equal to a maximum diameter of an electron beam to be measured; a diameter or a width of the porous carbon material layer is smaller than a minimum diameter of a cross section of the electron beam to be measured; and the porous carbon material layer comprises a plurality of carbon material particles, and a plurality of micro gaps are defined by the plurality of carbon material particles; and
an electricity meter electrically connected to the porous carbon material layer;
step (S2), moving the electron beam to be measured for a first distance relative to the porous carbon material layer, the cross section of the electron beam to be measured passing through and scanning the suspended portion of the porous carbon material layer; and recording the first distance and a first electric signal value in the electricity meter to obtain a first curve, and analyzing the first curve to obtain a first diameter of the electron beam to be measured; and
step (S3), rotating the electron beam to be measured or the porous carbon material layer by an angle; moving the electron beam to be measured for a second distance relative to the porous carbon material layer, the cross section of the electron beam to be measured passing through and scanning the suspended portion of the porous carbon material layer; and recording the second distance and a second electric signal value in the electricity meter to obtain a second curve, and analyzing the second curve to obtain a second diameter of the electron beam to be measured.

14. The method of claim 13, wherein in the step (S2), the electron beam to be measured is moved for the first distance relative relatively to the porous carbon material layer in a direction perpendicular to a length of the porous carbon material layer.

15. The method of claim 13, wherein in the step (S3), the electron beam to be measured is moved for the second distance relatively to the porous carbon material layer in a direction perpendicular to a width of the porous carbon material layer.

16. The method of claim 13, wherein in the first curve, a distance from a point where a current value starts to increase from zero to a point where a current value drops to zero again is the first diameter of the electron beam to be measured.

17. The method of claim 13, wherein the step (S3) is repeated multiple times to obtain a plurality of third diameters of the electron beam to be measured.

18. The method of claim 13, wherein the porous carbon material layer consists of a plurality of pure carbon material particles, and a material of the plurality of pure carbon material particles consists of carbon atoms.

19. The method of claim 18, wherein the porous carbon material layer is a porous carbon material wire structure or a porous carbon material stripe structure.

20. The method of claim 18, wherein the plurality of carbon material particles is selected from a group consisting of carbon nanotubes, carbon fibers, carbon nanowires, carbon microspheres and carbon nanospheres.

* * * * *